United States Patent [19]

Ochii et al.

[11] Patent Number: 5,204,834
[45] Date of Patent: Apr. 20, 1993

[54] STATIC SEMICONDUCTOR MEMORY DEVICE

[75] Inventors: Kiyofumi Ochii; Shigeyuki Hayakawa, both of Yokohama, Japan

[73] Assignee: Kabushiki Kaisha Toshiba, Kawasaki, Japan

[21] Appl. No.: 705,558

[22] Filed: May 24, 1991

[30] Foreign Application Priority Data

May 28, 1990 [JP] Japan .................... 2-137336

[51] Int. Cl.⁵ .............................. G11C 13/00
[52] U.S. Cl. ........................ 365/154; 365/148
[58] Field of Search ............ 365/154, 155, 222, 226, 365/227, 148

[56] References Cited

U.S. PATENT DOCUMENTS 4,139,786 2/1988 Madland .............. 365/222
4,727,518 2/1988 Madland .
4,805,147 2/1989 Yamanaka et al. .

FOREIGN PATENT DOCUMENTS 0348895 1/1990 .

OTHER PUBLICATIONS

Sasaki et al., IEEE Journal of Solid-State Circuits, "A 9-ns 1-Mbit CMOS SRAM," vol. 24, No. 5, Oct. 24, 1989.

Primary Examiner—Terrell W. Fears
Attorney, Agent, or Firm—Finnegan, Henderson, Farabow, Garrett & Dunner

[57] ABSTRACT

A plurality of static memory cells 10 each comprising a thin film transistor acting as a load are connected to a power source wiring 12 positioned within a memory cell array. The power source wiring 12 positioned within the memory cell array is connected via a resistor circuit 14 to a power source wiring 13 of a low resistivity, which is positioned outside the memory cell array.

10 Claims, 7 Drawing Sheets

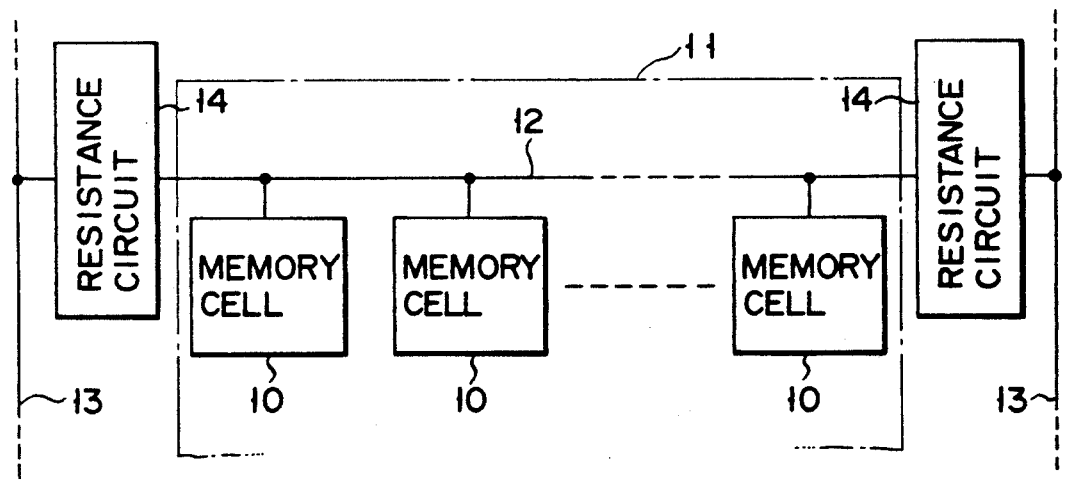
F I G. 4

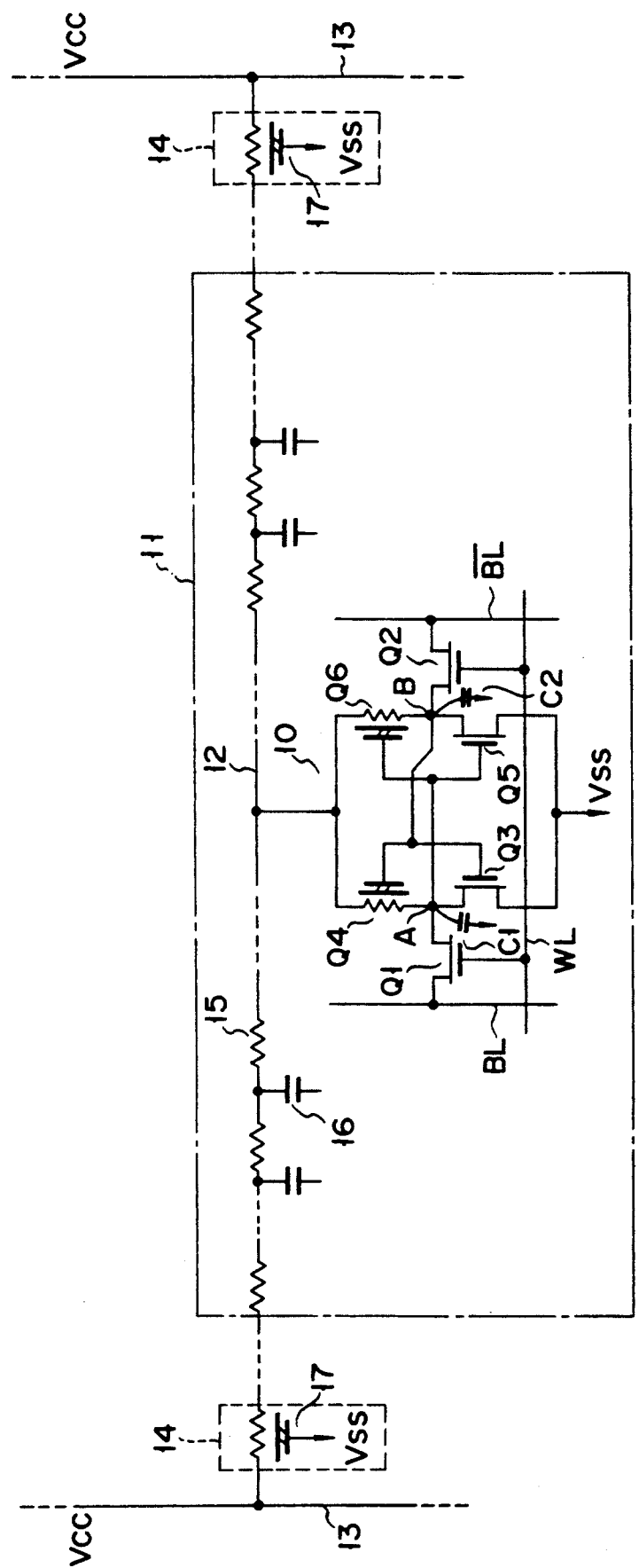
F I G. 5

STATIC SEMICONDUCTOR MEMORY DEVICE

BACKGROUND OF THE INVENTION

1. Field of the Invention

The present invention relates to a static semiconductor memory device comprising a memory cell using a thin film transistor as a load element.

2. Description of the Related Art

Known memory cells used in a static semiconductor memory device (hereinafter referred to as "SRAM") include, for example, a complete CMOS memory cell utilizing p-channel and n-channel MOS transistors formed in a silicon substrate or in a well region of the silicon substrate as a load transistor and a driving transistor, respectively, and a memory cell using a polycrystalline silicon of a high resistivity as a load element.

A marked increase in the capacity has been achieved nowadays in the memory device comprising a memory cell using a polycrystalline silicon of a high resistivity as a load element. The polycrystalline silicon used in a memory cell of this type has a resistance as high as several tera ohms ($10^{12}$ Ω) in order to keep the current consumption as low as possible during the rest time, i.e., when any of memory cells is not selected. Naturally, the amount of the signal charge supplied to a data memory node within the memory cell is very small. This causes a problem when current leaks from the data memory node through, for example, a PN junction, an insulating film or a transistor. Specifically, the signal charge precharged on the data memory node is more released than that supplied from a load element, that is, data is more liable to be destroyed. Suppose leak current takes place in only one of a large number of memory cells included in a memory device. In this case, the defective memory cell lowers the reliability of the entire memory cell.

Recently, a static memory cell using a thin film transistor (hereinafter referred to as "TFT") as a load element has been developed as a technique capable of solving the above-noted problem inherent in the memory cell using a polycrystalline silicon of a high resistivity as a load element. The TFT is a transistor having the channel region formed in a thin polycrystalline silicon film, not in a silicon substrate. The TFT can be formed in a stacked manner on an ordinary MOS transistor (bulk transistor) having the channel region formed in a silicon substrate. If a TFT is used in place of the p-channel MOS transistor included in a complete CMOS memory cell, the complete CMOS memory cell can be formed with a cell area substantially equal to that of the conventional memory cell using a polycrystalline silicon as a load resistor. In other words, the static memory cell using a TFT as a load element is complete CMOS memory cell. In addition, the memory cell using a TFT permits a high degree of integration like the memory cell using a polycrystalline silicon and also permits a low power consumption and a stable operation like the complete CMOS memory cell.

FIG. 1 is an equivalent circuit diagram showing a static memory cell using a TFT. It is seen that the memory cell comprises two transfer gates consisting of N-channel MOS transistors Q1 and Q2, respectively. A bit line BL is connected to one end of the transistor Q1 (transfer gate), and another bit line /BL to one end of the transistor Q2 (transfer gate). The other ends of these transistors Q1, Q2 are connected to inner memory nodes (data storing nodes) A and B, respectively. Further, the gates of the transistors Q1 and Q2 are commonly connected to a word line WL.

Connected to the inner memory node A are the drain of an N-channel MOS transistor Q3 and the drain of a P-channel TFT Q4. The gates of these transistors Q3 and Q4 are commonly connected to the other inner memory node B. Also connected to the node B are the drain of an N-channel MOS transistor Q5 and the drain of a TFT Q6. The gates of these transistors Q5 and Q6 are commonly connected to the inner memory node A.

The sources of the transistors Q4 and Q6 are connected to a supply node of a power source potential Vcc, with the sources of the transistors Q3 and Q5 being connected to a supply node of a ground potential Vss.

In the memory cell shown in FIG. 1, the transistors Q3 and Q4 form a CMOS inverter. Likewise, transistors Q5 and Q6 form a CMOS inverter. The TFT used as a load element of each of these CMOS inverters functions as a transistor, with the result that current hardly flows to the inner memory node when the TFT is turned off. When the TFT is turned on, however, an oncurrent, which is sufficiently large compared with the memory cell using a load element of a high resistance, flows to the inner memory node.

FIG. 2 shows the relationship between the gate voltage VG (volt) and the drain current ID (ampere) in a typical TFT sized, for example, at 1.5 μm in the channel length, 0.5 μm in the channel width, 25 nm in the thickness of the gate insulation film and 36 nm in the thickness of the polycrystalline silicon layer in which is formed the channel region. The drain voltage is set at −4 V.

As apparent from FIG. 2, the drain current is about $10^{-13}$ (A) when the TFT is turned off, with the gate voltage VG set at 0 V. On the other hand, the drain current is about $10^{-7}$ (A) when the gate voltage is set at −4 V so as to turn the TFT on. It follows that the TFT exhibits an on/off current ratio of about 6 figures, i.e., a resistance ratio of about 6 figures.

On the other hand, each of the inner memory nodes A and B of the memory cell is accompanied by a parasitic capacitance (not shown). The parasitic capacitance tends to be diminished in accordance with the scaling of the memory cell size. However, it is impossible to diminish the parasitic capacitance to a level lower than 10 fF, i.e., $10^{-14}$ F, because of the restrictions such as the resistance to soft error. It follows that the time constant in charging/discharging the inner memory nodes by the on-current of the TFT is about 100 ns ($10^{-7}$ A $\times 10^{-14}$ F = $10^{-7}$ s).

Let us consider a case where the power source potential Vcc supplied to the memory cell is changed in the circuit shown in FIG. 1. In general, such a change in the power source potential is called a power source bump. FIG. 3 shows a change in the potential within the memory cell. A symbol "τ 1" shown in the drawing denotes a time constant of the potential Vnod in the case where the inner memory node A or B is charged by the on-current of the TFT. During the period between time t1 and time t2 shown in FIG. 3, the potential difference between the power source potential Vcc and the potential Vnod is greater than the threshold voltage Vth of the P-channel TFT. During this period, the TFT, which should originally be turned off, is also turned on, with the result that this TFT is connected in series to the TFT which is turned from off-state to on-state. It follows that current flows through the N-channel MOS transistor, which is already in an on-state, for a predetermined period of time, i.e., about 100 ns as noted previously. It should be noted that a TFT, which is turned off, is always included in each memory cell. Thus, current of at least $10^{-1}$ A, i.e., 100 mA, flows through the memory cell array when it comes to an SRAM of a large capacity, e.g., at least 4M bits ($4 \times 10^6$ bits). Since the average operating current of the ordinary SRAM is less than 100 mA, the current exceeding 100 mA which flows during the power source bump through an SRAM of 4M bits or more becomes an abnormal current far exceeding the allowable limit.

In general, the power source wiring positions, within the memory cell array for supplying the power source potential to each memory cell is formed of a polycrystalline silicon. A resistance component and a stray capacitance component are included in the power source wiring formed of the polycrystalline silicon. Thus, the power source wiring positioned within the memory cell array can be regarded as a delay line. On the other hand, that portion of the power source wiring for supplying the power source potential to each memory cell which is positioned outside the memory cell array is generally formed of aluminum. Naturally, the power source wiring formed of aluminum is electrically connected within the memory cell array to the power source wiring formed of polycrystalline silicon, which is positioned within the memory cell array. To reiterate, the polycrystalline silicon wiring can be regarded as a delay line. On the other hand, the resistivity of the aluminum wiring is very low. It follows that the time constant of the polycrystalline silicon wiring is diminished with respect to the memory cell positioned closer to the connecting point between the aluminum wiring and the polycrystalline silicon wiring, with the result that a greater DC current flows through said memory cell during the power source bump.

SUMMARY OF THE INVENTION

As described above, the conventional static semiconductor memory device using a TFT as a load element within the memory cell is defective in that an abnormal current flows through each memory cell during the power source bump, leading to an increased power consumption.

An object of the present invention is to provide a static semiconductor memory device, which permits preventing the flow of an abnormal current through each memory cell during the power source bump so as to diminish the power consumption.

According to one embodiment of the present invention, there is provided a static semiconductor memory device, comprising a memory cell array consisting of a plurality of memory cells each having a data memory node and a thin film transistor used as a load transistor and connected to one end of the memory node; a first power source wiring arranged within the memory cell array, and connected to each memory cell so as to supply a power source potential to each memory cell; a second power source wiring of a low resistance to which a power source potential is supplied from the outside and which is electrically connected to the first power source wiring; and circuit means satisfying the relationship $\tau 2 \geq \tau 1$ wherein $\tau 1$ denotes a time constant in the case of charging/discharging the memory node of each memory cell by the first power source wiring, and $\tau 2$ represents a time constant in the case of charging/discharging the first power source wiring by the external power source potential supplied to the second power source wiring.

According to another embodiment of the present invention, there is provided a static semiconductor memory device, comprising a memory cell array consisting of a plurality of memory cells each having a data memory node and a thin film transistor used as a load transistor and connected to one end of the memory node; a power source wiring connected to each memory cell included in the memory cell array so as to supply a power source potential to each memory cell; and a capacitor connected between the memory node of each memory cell and the power source wiring.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a block diagram showing a static semiconductor memory device according to a first embodiment of the present invention;

FIG. 5 is a circuit diagram showing in detail the construction of a part of the memory device shown in FIG. 4;

DETAILED DESCRIPTION OF THE PREFERRED EMBODIMENTS

Figure 1:
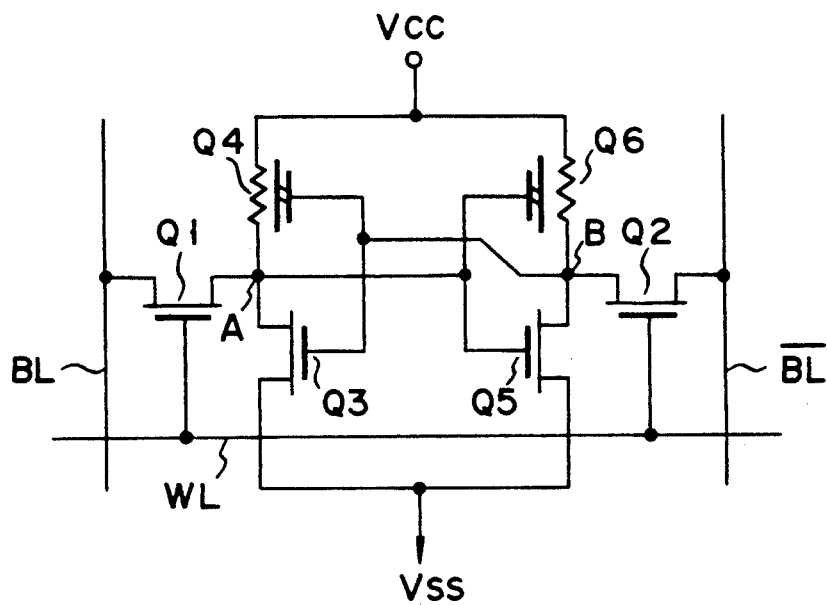
FIG. 1 is an equivalent circuit diagram showing the conventional static semiconductor memory cell using a TFT.
Figure 2:
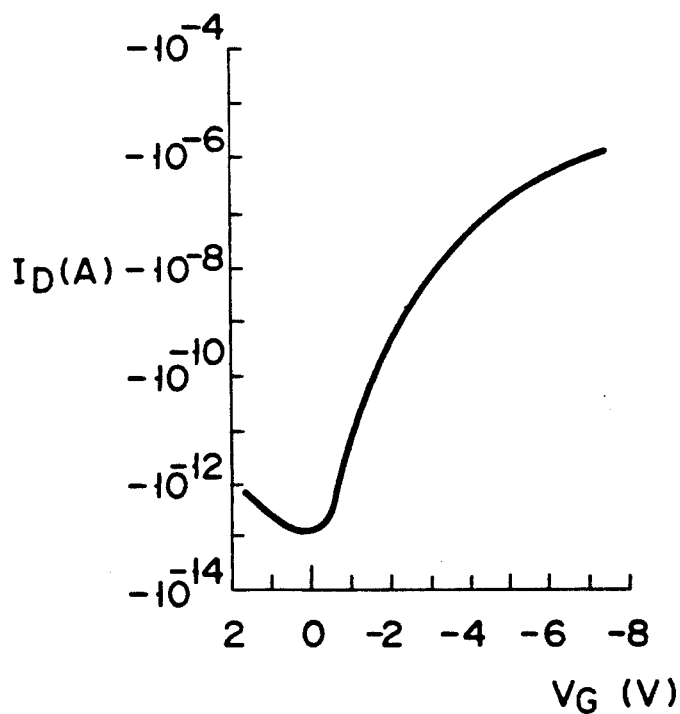
FIG. 2 shows the drain characteristics of a typical P-channel TFT.
Figure 3:
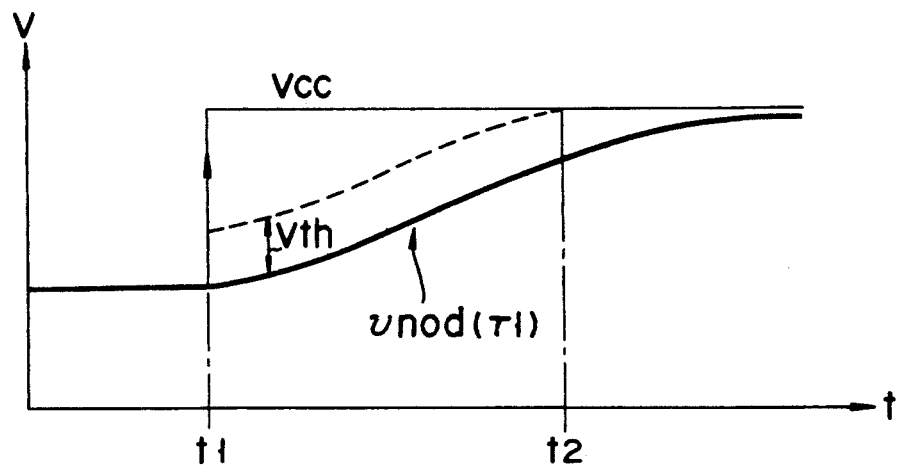
FIG. 3 shows a signal waveform for the conventional memory device.

FIG. 4 is a block diagram showing the construction of a static semiconductor memory device according to a first embodiment of the present invention. As seen from the drawing, the memory device comprises a plurality of memory cells 10, which are aligned in, for example, series to form a memory cell array 11. In general, these memory cells 10 are arranged to form a matrix within the memory cell array 11, though only a single row of memory cells 10 are shown in the drawing.

Each memory cell 10 is electrically connected to a power source wiring 12 positioned within the memory cell array 11. The wiring 12 is formed of, for example, polycrystalline silicon. A power source potential Vcc on the high potential side is supplied through the power source wiring 12 to each memory cell 10. The memory device also comprises another power source wiring 13 of a low resistance formed of, for example, aluminum and positioned outside the memory cell array. The power source potential Vcc from the outside is supplied through the aluminum wiring 13 to each part of the entire memory device. The power source wiring 12 positioned within the memory cell array is electrically connected via a resistor circuit 14 to the aluminum power source wiring 13.

FIG. 5 shows in detail the construction of one of the memory cells and the resistor circuit 14 included in the block diagram shown in FIG. 4. As in the prior art shown in FIG. 1, the memory cell 10 comprises transfer gates Q1 to Q2 each formed of an N-channel MOS transistor, N-channel MOS transistor Q3, Q5, and P-channel TFTs Q4, Q6. The memory cell also comprises inner memory nodes A and B as in the prior art shown in FIG. 1. Further, memory capacitors C1 and C2 are equivalently connected to the inner memory nodes A and B, respectively.

The source of each of the TFTs Q4 and Q6 is connected to the power source wiring 12 formed of polycrystalline silicon. The power source potential Vcc on the high potential side is supplied through the polycrystalline silicon wiring 12 to each memory cell 10. A parasitic resistance component 15 and a stray capacitance component 16 reside in the polycrystalline silicon wiring 12, as shown in FIG. 5.

Each of the resistance circuits 14 can be formed of, for example, a polycrystalline silicon having a high resistivity or a TFT equal in construction to the TFT Q4 or Q6 included in the memory cell 10. In this embodiment, the resistance circuit 14 is formed of a TFT 17 having the gate connected to the ground potential Vss. The resistance of the TFT 17 is set to meet the relationship $\tau 2 \geq \tau 1$, in which $\tau 1$ denotes a time constant in the case of charging the inner memory node A or B by the power source potential transmitted to the power source wiring 12 positioned within the memory cell array, and $\tau 2$ represents a time constant in the case of charging the power source wiring 12 by the power source potential transmitted to the aluminum power source wiring 13. The resistance of the TFT 17 can be changed by controlling, for example, the channel width or channel length of the TFT.

Figure 6:
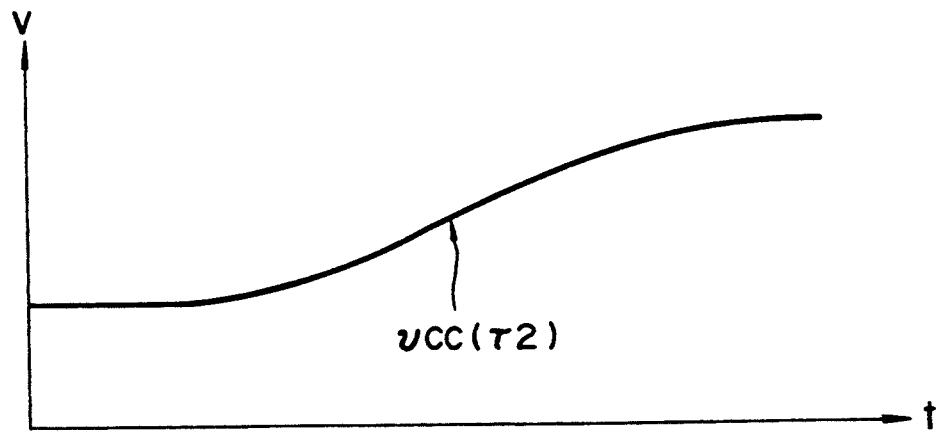
FIG. 6 shows a signal waveform for the memory device according to the first embodiment of the present invention.

Suppose the potential of the aluminum wiring 13 positioned outside of the memory cell array has been rapidly elevated in the memory device of the construction described above. Even in this case, the resistance circuit 14 serves to lower the charging rate of the power source wiring 12 positioned within the memory cell array, as apparent from the waveform shown in FIG. 6. To be more specific, the time constant $\tau 2$ is increased in this step. The inner memory node A or B included in each memory cell 10 is charged by the potential of the power source wiring 12 having a low charging rate. It should be noted that the charging rate of the capacitor C1 or C2 include in the inner memory node A or B is close to the charging rate of the power source wiring 12 positioned within the memory cell array. As a result, the TFT Q4 or Q6 which turned off, included in the memory cell 10, is not turned on in the case of the power source bump. It follows that it is possible to prevent a difficulty accompanying the conventional memory cell, i.e., flow of a DC current between the power source potential Vcc and the ground potential Vss.

Where the TFT 17 constituting each of the resistance circuits 14 is equal in construction and size to each of the TFTs Q4 and Q6 included in the memory cell 10 in the embodiment described above, the on-resistance of the TFT 17 is equal to that of the TFT included in the memory cell. It should also be noted that the sum of the stray capacitance components 16 of the power source wiring 12 positioned within the memory cell array is greater than the capacitance C1, C2 within the memory cell so as to meet the relationship $\tau 2 \geq \tau 1$.

Figure 7:
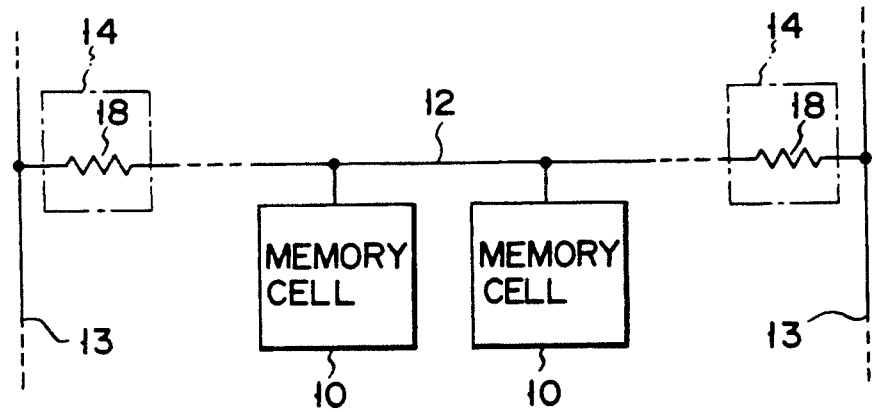
FIG. 7 is a circuit diagram showing a static semiconductor memory device according to a second embodiment of the present invention.

FIG. 7 shows a memory device according to a second embodiment of the present invention. In this embodiment, the resistance circuit 14 is formed of a resistance element 18 consisting of, for example, a polycrystalline silicon. As described previously, the power source wiring 12 positioned within the memory cell array is also formed of a polycrystalline silicon. In general, a p-type or N-type impurity is diffused into the polycrystalline silicon so as to lower the resistance of the power source wiring 12. What should be noted is that the resistance element 18 noted above can be formed by diffusing a low concentration of an impurity element into a part of the polycrystalline silicon forming the power source wiring 12.

Figure 8:
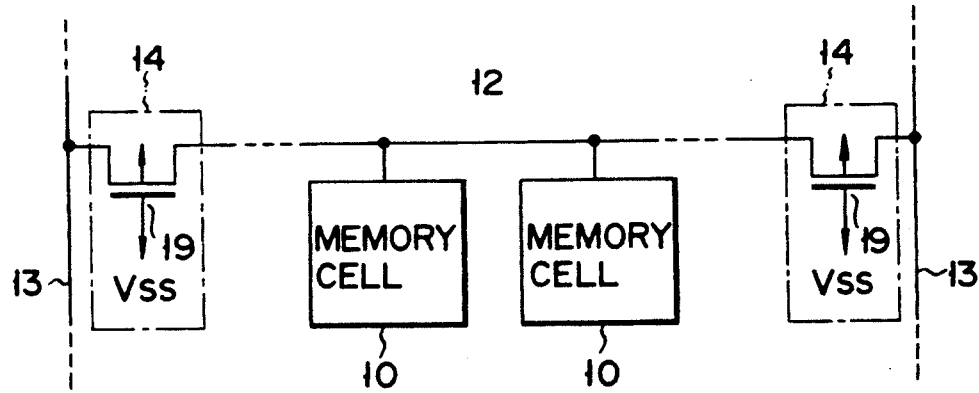
FIG. 8 is a circuit diagram showing a static semiconductor memory device according to a third embodiment of the present invention.

FIG. 8 shows a memory device according to a third embodiment of the present invention. In this embodiment, each of the resistance circuits 14 is formed of a P-channel enhancement type MOS transistor 19. The gate of the MOS transistor 19 is connected to the ground potential Vss. It should be noted that the resistance of the circuit 14 can be controlled by adjusting, for example, the channel width or the channel length of the MOS transistor 19.

Figure 9:
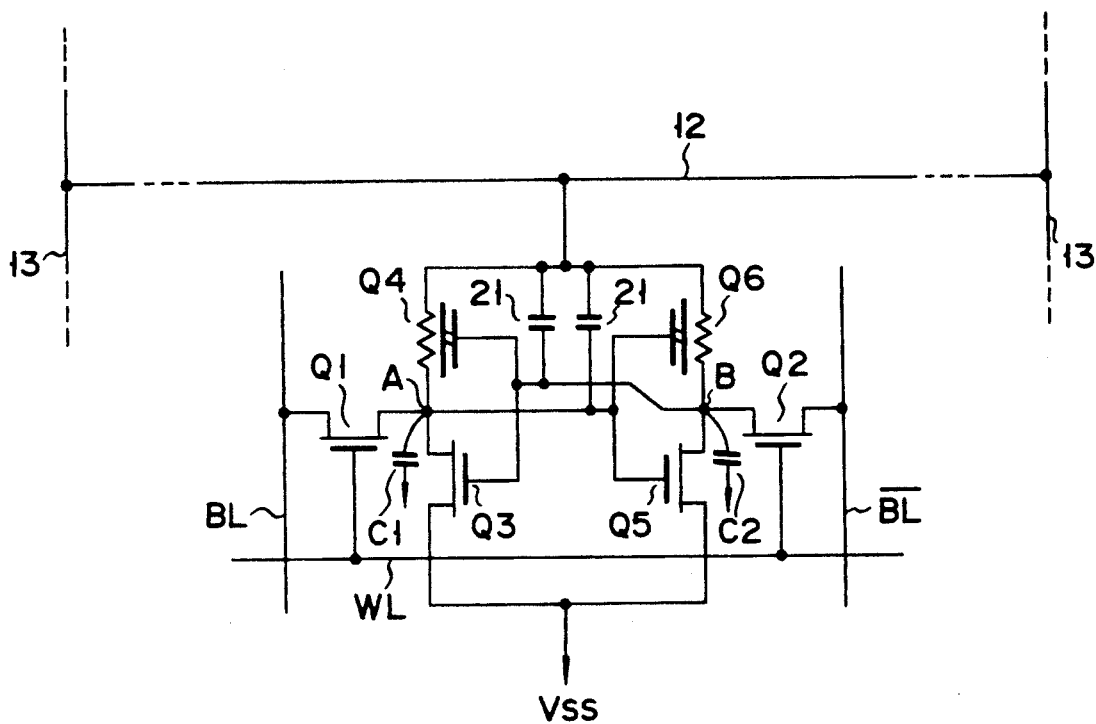
FIG. 9 is a circuit diagram showing a static semiconductor memory device according to a fourth embodiment of the present invention.

FIG. 9 is circuit diagram showing the construction of a memory cell in a static semiconductor memory device according to a fourth embodiment of the present invention. In this embodiment, a capacitance 21 substantially equal to the capacitance C1 of the inner memory node A included in the memory cell 10 is connected between the node A and the power source wiring 12 positioned within the memory cell array. Likewise, another capacitance 21 substantially equal to the capacitance C2 of the inner memory node B is connected between the node B and the power source wiring 12. Suppose the potential of the power source wiring 13 positioned outside the memory cell array has been rapidly elevated in the stage of the power source bomb in the memory device of the construction described above. Where the potential of the power source wiring 12 positioned within the memory cell array has been elevated in accordance with elevation of the potential of the aluminum power source wiring 13, the potential of the inner memory nodes A and B is also elevated because of the capacitive coupling of each of the capacitances 21. In this case, if the difference between the gate potential of the TFT, which should originally be turned off, and the source potential of said TFT, which is equal to the potential of the power source wiring 12 positioned within the memory cell array, is lower than the threshold voltage of the TFT, the TFT is kept turned off. In other words, it is necessary to determine the capacitance value of each of the capacitors 21 to meet the particular condition.

In the fourth embodiment described above, the TFT Q4 or Q6, which is turned off, is prevented from being turned on, making it possible to prevent the difficulty accompanying the prior art, i.e., flow of a DC current through each memory cell between the power power source potential Vcc and the ground potential Vss.

Figure 10A:
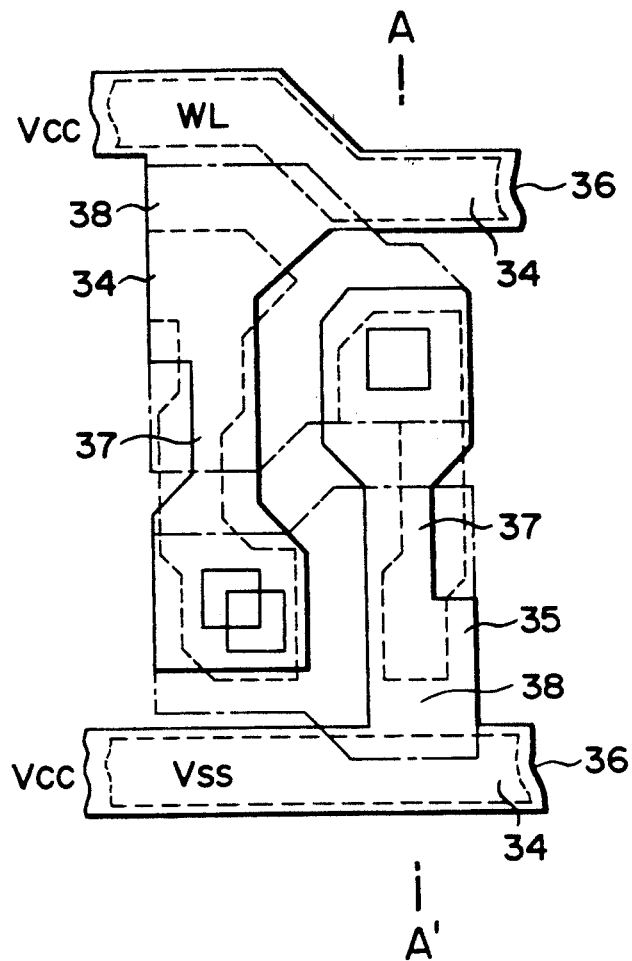
FIG. 10A is a plan view of a TFT used in the memory device according to the fourth embodiment of the present invention.
Figure 10B:
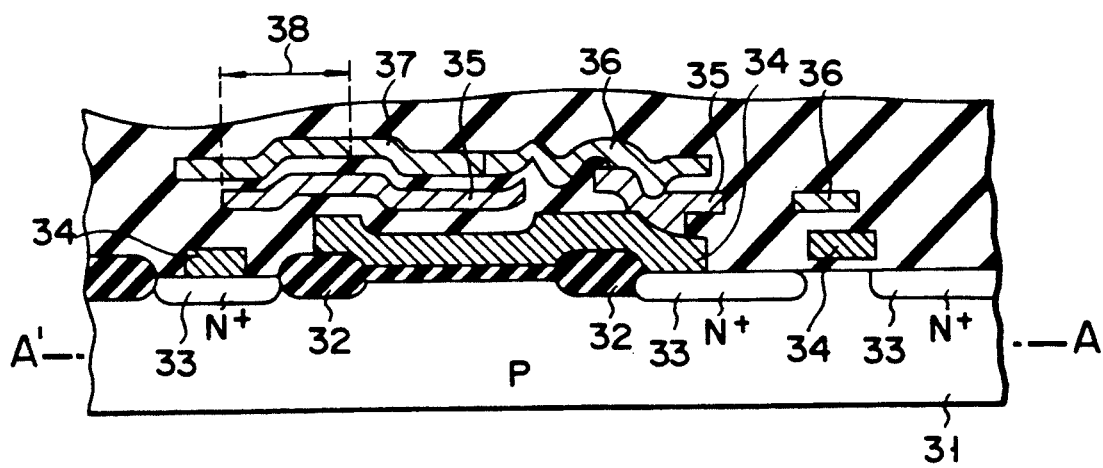
FIG. 10B is a cross sectional of the TFT shown in FIG. 10A.

FIGS. 10A and 10B show the specific construction of the memory cell used in the static semiconductor memory device according to the fourth embodiment of the present invention described above. Specifically, FIG. 10A is a plan view of the memory cell, and FIG. 10B is a cross sectional view along the line A-A' shown in FIG. 10A. The memory cell is prepared by adding the two capacitors 21 to the conventional memory cell using a TFT as a load. As shown in the drawings, the memory cell comprises a P-type semiconductor substrate 31, a field insulation film 32, N+ diffusion regions 33 acting as source and drain regions of the N-channel MOS transistors Q1, Q2, Q3, and Q5 referred to previously, a first polycrystalline silicon layer 34 forming the gates of the N-channel MOS transistors Q1, Q2, Q3 and Q5, a second polycrystalline silicon layer 35 forming the gates of the P-channel TFTs Q4 and Q6, a third polycrystalline silicon layer 36 forming the channel regions as well as source and drain regions of the TFTs Q4 and Q6, and a channel region 37 of a TFT, said channel region 37 being formed within the third polycrystalline silicon layer 36. The channel region 37 is substantially free from an impurity and, thus, has a high resistivity. The word line WL as well as a power source line for supplying a ground potential Vss to each memory cell is formed of the first polycrystalline silicon layer 34. Also, the power source wiring 12 positioned within the memory cell array is formed by utilizing the third polycrystalline silicon layer 36. Incidental, the N+ diffusion region is not shown in FIG. 10A. Also, FIG. 10B does not show the insulating films interposed between the first polycrystalline silicon layer 34 and the substrate 31 and between the first and second polycrystalline silicon layers 34 and 35.

Each of the capacitors 21 is provided by each of regions 38 in which the second and third polycrystalline silicon layers 35 and 36 are superposed one upon the other with an insulating film (not shown) interposed therebetween. In other words, the second polycrystalline silicon layer 35 constituting the gate of the TFT acts as one electrode of the capacitor 21, and the third polycrystalline silicon layer 36, within which the channel region 37 of the TFT is formed, acts as the other electrode of the capacitor 21.

Figure 11A:
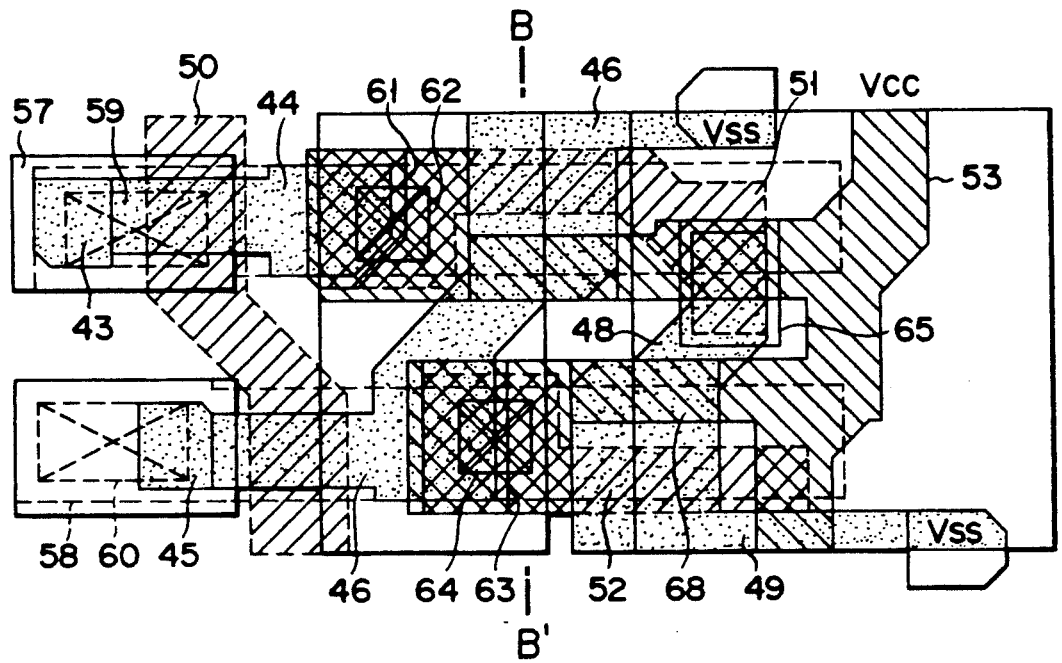
FIG. 11A is a plan view of another TFT used in the memory device according to the fourth embodiment of the present invention.
Figure 11B:
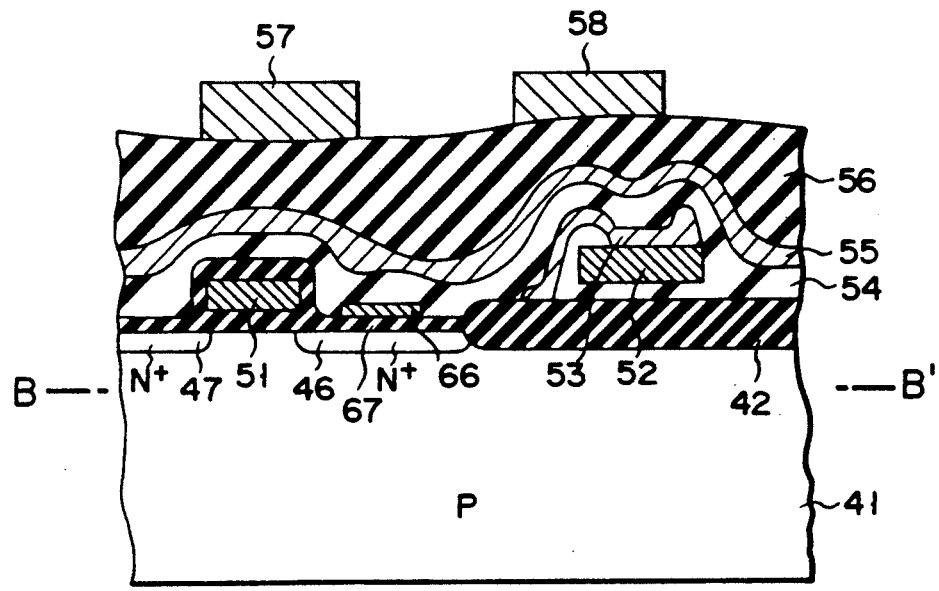
FIG. 11B is a cross sectional of the TFT shown in FIG. 11A.

FIG. 11A is a plan view showing the construction of a memory cell having the capacitor 21 added thereto, and FIG. 11B is a cross sectional view along the line B-B' shown in FIG. 11A. The memory cell shown in FIG. 11 comprises a P-type semiconductor substrate 41, a field insulation film 42, an N+ diffusion region 43 providing the source or drain region of the N-channel MOS transistor Q1, an N+ diffusion region 44 providing the drain or source region of the N-channel MOS transistor Q1, an N+ diffusion region 45 providing the source or drain region of the N-channel MOS transistor Q2, an N+ diffusion region 46 providing the drain or source region of the N-channel MOS transistor Q2 and drain region of the N-channel MOS transistor Q5, an N+ diffusion region 47 providing the source region of the N-channel MOS transistor Q5, an N+ diffusion region 48 providing the drain region of the N-channel MOS transistor Q3, an N+ diffusion region 49 providing the source region of the N-channel MOS transistor Q3, gates 50 of the N-channel MOS transistors Q1, Q2, said gates 50 being formed of the first polycrystalline silicon layer, a gate 51 of the N-channel MOS transistor Q5, said gate 51 being formed of the first polycrystalline silicon layer, a gate 52 of the N-channel MOS transistor Q3, said gate 52 being formed of the first polycrystalline silicon layer, a second polycrystalline silicon layer 53 having a thickness of about 200 Å, an insulating film 54 formed on the second polycrystalline silicon layer 53, a third polycrystalline silicon layer 55 formed on the insulating film 54 and supplied with the power source potential Vcc, an interlayer insulating film 56 formed on the third polycrystalline silicon layer 55, and aluminum wiring layers 57 and 58 formed on the interlayer insulating film 56 so as to form the bit lines BL and /BL, respectively.

The aluminum wiring layer 57 is connected to the N+ diffusion region 43 via a contact hole 59. The other aluminum wiring layer 58 is connected to the N+ diffusion region 45 via a contact hole 60. The N+ diffusion region 44 is connected to the gate 51 of the N-channel MOS transistor Q5 via a contact hole 61. The gate 51 is connected to the second polycrystalline silicon layer 53 via a contact hole 62. The N+ diffusion region 46 is connected to the gate 52 of the N-channel MOS transistor Q3 via a contact hole 63. The gate 52 is connected to the second polycrystalline silicon layer 53 via a contact hole 64. Further, the N+ diffusion region 48 providing the drain region of the N-channel MOS transistor Q3 is connected to the gate 51 of the N-channel MOS transistor Q5 via a contact hole 65.

A P-type impurity element is introduced in a high concentration into most portion of the second polycrystalline silicon layer 53 so as to lower the resistivity of the polycrystalline silicon layer 53. However, an impurity is not positively introduced into that region 66 of the polycrystalline silicon layer 53 which faces the N+ diffusion region 46 so as to keep the high resistivity in the region 66. It should be noted that the region 66, which acts as the channel region of the TFT Q4, is superposed upon the N+ diffusion region 46 with a thermal oxide film 67 interposed therebetween, said oxide film 67 being formed by the thermal oxidation of said N+ diffusion region region 46.

Further, a region 68 of the polycrystalline silicon layer 53, said region 68 facing the N+ diffusion region 48, is substantially free from an impurity and, thus, exhibits a high resistivity. The region 68, which acts as the channel region of the TFT Q6, is superposed upon the N+ diffusion region 48 with a thermal oxide film (not shown) interposed therebetween, said oxide film being formed by the thermal oxidation of said N+ diffusion region region 48.

Each of the capacitors 21 is provided by the region in which the second and third polycrystalline silicon layer 53 and 55 are superposed one upon the other with the insulating film 56 interposed therebetween. To be more specific, one electrode of the capacitor 21 is provided by the second polycrystalline silicon layer 53 in which is formed the channel region of the TFT. Likewise, the other electrode is provided by the third polycrystalline silicon layer 55 which is set at the power source potential Vcc and positioned above the second polycrystalline silicon layer 53 with the insulating film 54 interposed therebetween.

The present invention is not restricted to the embodiments described above. Of course, various modifications are available within the technical scope of the present invention. For example, in each of the first to third embodiments, the power source voltage Vcc of a high potential is supplied to the power source wiring 12 positioned within the memory cell array so as to charge the inner memory nodes A and B by the potential of the wiring 12. However, it is also possible to supply a potential lower than the ground voltage Vss, i.e., a negative potential, to the wiring 12 for operating the memory cell. In this case, the negative charge of the inner memory nodes A and B included in each memory cell is released into the wiring 12.

Also, the channel region of the TFT is formed in a thin polycrystalline silicon film in each of the first to fourth embodiments described above. However, it is also possible to form the channel region of the TFT within a film prepared by re-growing an amorphous silicon thin film.

As described above in detail, the present invention provides a static semiconductor memory device which permits preventing an abnormal current from flowing through the memory cell during the power source bomb so as to diminish the current consumption.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A static semiconductor memory device, comprising a memory cell array consisting of a plurality of memory cells each having a data memory node and a thin film transistor used as a load transistor and connected to one end of the memory node;
    a first power source wiring arranged within the memory cell array, and connected to each memory cell so as to supply a power source potential to each memory cell;
    a second power source wiring of a low resistance to which a power source potential is supplied from the outside and which is electrically connected to the first power source wiring; and
    circuit means satisfying the relationship $\tau 2 \geq \tau 1$ wherein $\tau 1$ denotes a time constant in the case of charging/discharging the memory node of each memory cell by the first power source wiring, and $\tau 2$ represents a time constant in the case of charging/discharging the first power source wiring by the external power source potential supplied to the second power source wiring.

2. The static semiconductor memory device according to claim 1, wherein said first power source wiring is formed of a polycrystalline silicon, and said second power source wiring is formed of aluminum.

3. The static semiconductor memory device according to claim 1, wherein said circuit means satisfying the relationship $\tau 2 \geq \tau 1$ is formed of a resistance circuit interposed between the first power source wiring and the second power source wiring.

4. The static semiconductor memory device according to claim 2, wherein said resistance circuit is formed of a transistor equivalent to the thin film transistor used as a load transistor in each memory cell.

5. The static semiconductor memory device according to claim 2, wherein said resistance circuit is formed of a resistance element.

6. The static semiconductor memory device according to claim 2, wherein said resistance circuit is formed of an enhancement type MOS transistor having the gate supplied with a predetermined bias voltage, said transistor being always kept conductive.

7. A static semiconductor memory device, comprising a memory cell array consisting of a plurality of memory cells each having a data memory node and a thin film transistor used as a load transistor and connected to one end of the memory node;
    a power source wiring connected to each memory cell included in the memory cell array so as to supply a power source potential to each memory cell; and
    a capacitor connected between the memory node of each memory cell and said power source wiring.

8. The static semiconductor memory device according to claim 7, wherein the capacitance of the capacitor is set to meet said relationship $Vcc - Vnod \leq Vth$, where Vcc denotes the potential at said power source wiring, Vnod represents the potential at said memory node for each memory cell, and Vth is the threshold voltage of said thin film transistor.

9. The static semiconductor memory device according to claim 7, wherein one of the electrodes included in said capacitor is provided by a first conductive layer forming the gate of the thin film transistor and the other electrode of the capacitor is provided by a second conductive layer in which is formed the channel of a thin film transistor, said second conductive layer being superposed on the first conductive layer with an insulating layer interposed therebetween.

10. The static semiconductor memory device according to claim 7, wherein one of the electrodes included in said capacitor is provided by a first conductive layer in which is formed the channel of a thin film transistor, and the other electrode of the capacitor is provided by a second conductive layer superposed on the first conductive layer with an insulating layer interposed therebetween.

* * * * *